United States Patent [19]

Suzuki et al.

[11] Patent Number: 5,714,406
[45] Date of Patent: Feb. 3, 1998

[54] METHOD FOR FORMING FILM ON SEMICONDUCTOR SUBSTRATE BY THERMAL CVD METHOD

[75] Inventors: Takashi Suzuki; Akihito Yamamoto, both of Yokkaichi; Hiroshi Ogino, Oita; Yoshio Kasai, Yokohama, all of Japan

[73] Assignee: Kabushiki Kaisha Toshiba, Kawasaki, Japan

[21] Appl. No.: 640,257

[22] Filed: Apr. 30, 1996

[30] Foreign Application Priority Data

May 1, 1995 [JP] Japan .................................. 7-107503

[51] Int. Cl.⁶ ............................................ H01L 21/302
[52] U.S. Cl. ................................... 437/225; 437/233
[58] Field of Search ............................. 437/233, 225; 118/723 E, 723 HC

[56] References Cited

U.S. PATENT DOCUMENTS 5,563,092  10/1996  Ohmi ......................... 118/723 E Primary Examiner—Charles L. Bowers, Jr.
Assistant Examiner—Vanessa Acosta
Attorney, Agent, or Firm—Finnegan, Henderson, Farabow, Garrett & Dunner, L.L.P.

[57] ABSTRACT

A semiconductor substrate is supported on a lower electrode provided within a chamber. The semiconductor substrate is heated up to about 600° to 700° by radiation heat from a halogen lamp. While the pressure within the chamber is reduced to about 0.1 to 1 Torr, the lower electrode is used as a positive electrode, and an upper electrode is used as a negative electrode. In this state, a DC voltage of 20 V is applied from a DC power supply. Then, a material gas is introduced into the chamber via an introducing hole, and a polysilicon film is grown on an oxide film on the semiconductor substrate. Electricity in the oxide film increases an initial growth rate of the polysilicon film and prevents formation of pinholes in the polysilicon film.

10 Claims, 3 Drawing Sheets

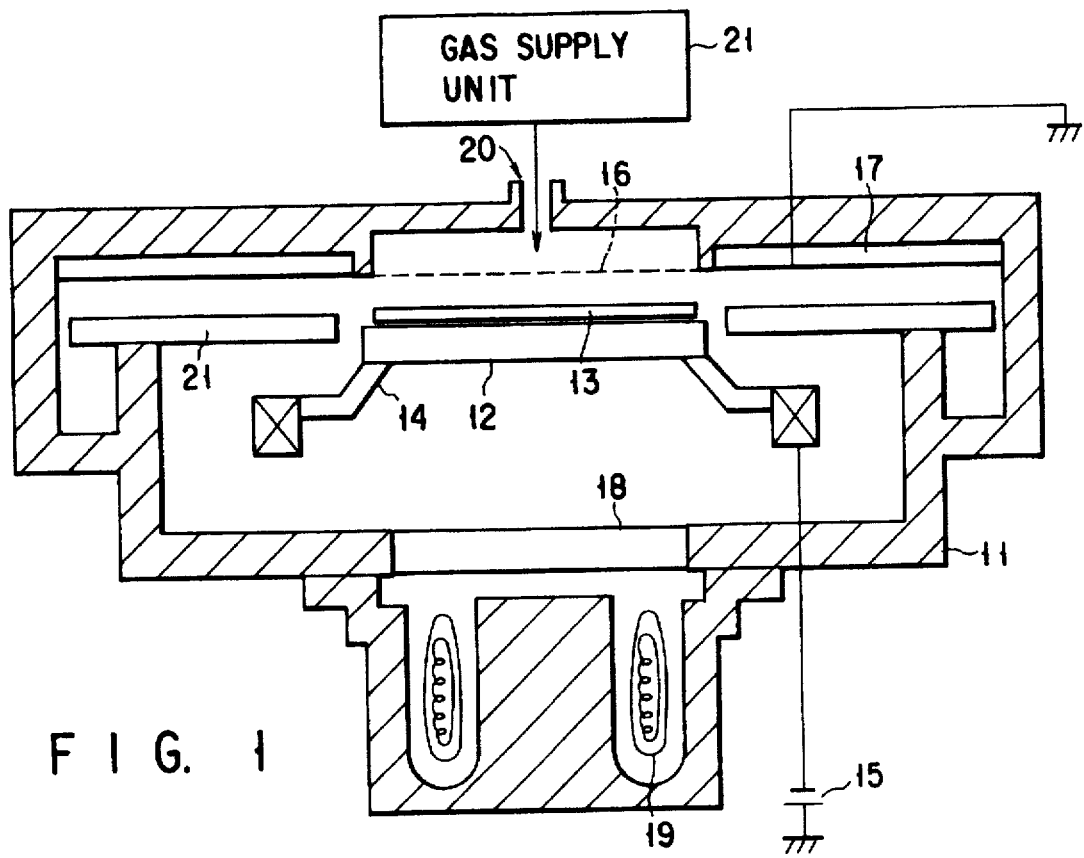
F I G. 1
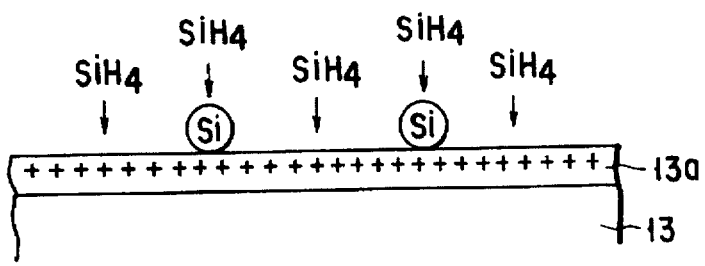
F I G. 2A
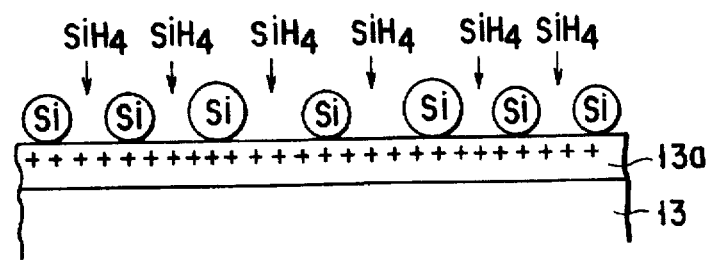
F I G 2B
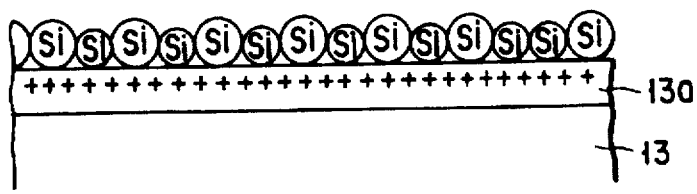
F I G. 2C

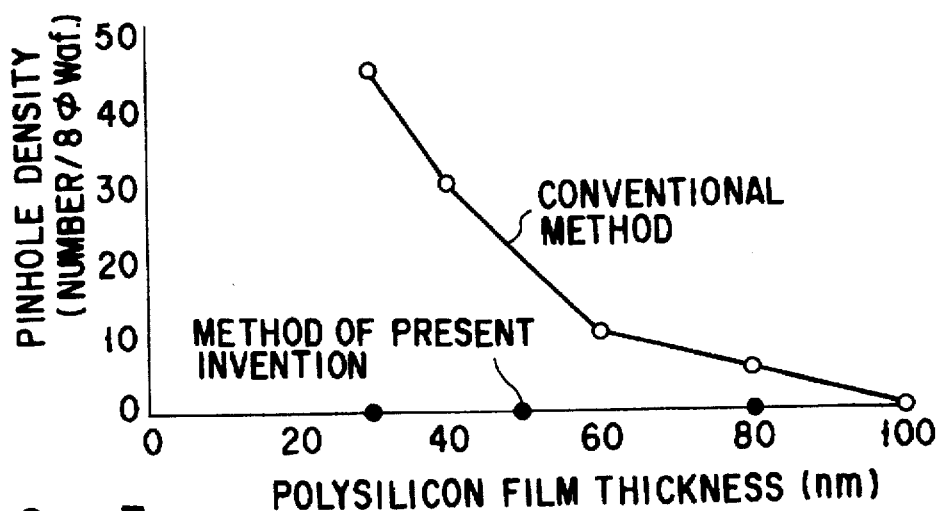
F I G. 3
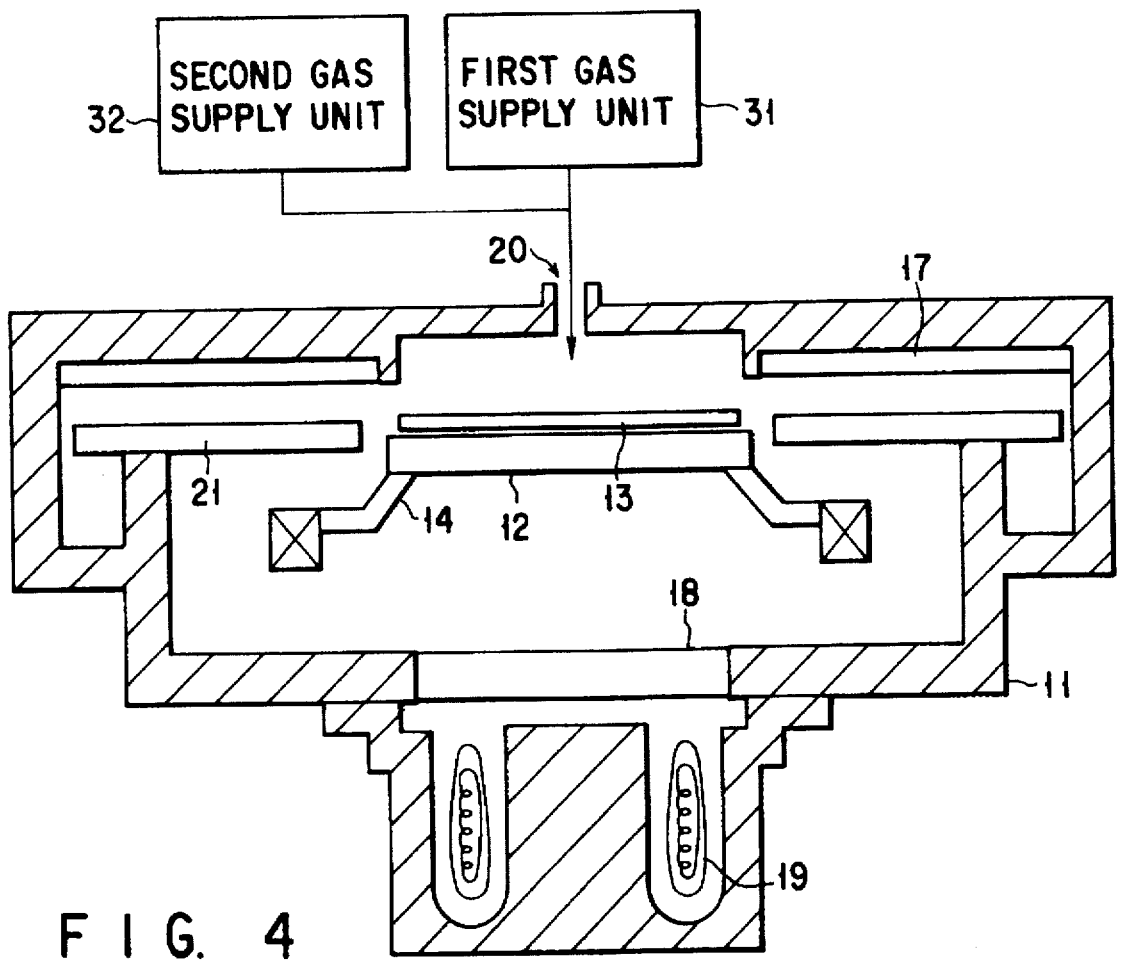
F I G. 4

(54) 5,714,406

METHOD FOR FORMING FILM ON SEMICONDUCTOR SUBSTRATE BY THERMAL CVD METHOD

BACKGROUND OF THE INVENTION

1. Field of the Invention

The present invention relates generally to a method and apparatus for fabricating a semiconductor device by forming a semiconductor film on a semiconductor substrate by, e.g. thermal CVD (chemical vapor deposition) method, and more particularly to a case where a polysilicon film is deposited on the semiconductor substrate.

2. Description of the Related Art

A thermal CVD method has widely been used as a conventional method of depositing a polysilicon film on a semiconductor substrate.

FIG. 5 shows a single-wafer-type thermal CVD apparatus for depositing a polysilicon film on a semiconductor substrate by a thermal CVD method.

In the single-wafer-type thermal CVD apparatus, a susceptor 2 formed of quartz is provided within a chamber 1, and a semiconductor substrate 3 is placed on the susceptor 2. The semiconductor substrate 3 is heated by a halogen lamp 5 through a window 4 formed of quartz. The pressure in the chamber 1 is reduced to a predetermined level, and in this state a material gas is introduced through a gas introducing hole 6. Thereby, a polysilicon film is formed on the semiconductor substrate 3.

In general, an oxide film is formed on the surface of the semiconductor substrate 3 on which a polysilicon film is deposited. It is conventionally known that the growth of the polysilicon film is more difficult on an oxide film than on a polysilicon film. In the case where the growth of a film depends on the material of the underlayer, as in this case, that is, in the case where there is selectivity of growth, if a polysilicon film with a thickness of 0.1 μm or less is deposited on an oxide film, pinholes, i.e. vacant portions, will form near the interface between the oxide film and polysilicon film.

FIGS. 6A to 6C show a modeled process of formation of pinholes. Specifically, if an oxide film 7 is provided on the surface of the semiconductor substrate 3, many pinholes 8 form in a polysilicon film while the polysilicon film is being formed. The presence of pinholes 8 in the polysilicon film results in various problems in a manufacturing process and electrical characteristics of a semiconductor device.

For example, when a polysilicon film is used as wiring material, the polysilicon film needs to be set in an electrically active state. For this purpose, in a step following deposition of the polysilicon film, impurities such as P or As are introduced in the polysilicon film by a thermal diffusion method or an ion injection method. In this case, if pinholes 8 are present in the polysilicon film, the impurities easily enter the underlying oxide film. Normally, the underlying film is used as insulating film. However, the oxide film containing the impurities considerably loses its insulation properties.

In recent years, there has been an increasing demand for finer processing of semiconductor devices and, accordingly, for thinner polysilicon films. At present, there have already been many manufacturing steps requiring film thickness of 0.1 μm or less, and it appears that this tendency will continue in the future. Thus, the formation of pinholes poses a serious problem.

SUMMARY OF THE INVENTION

The object of the present invention is to provide a method and apparatus for fabricating a semiconductor apparatus, wherein formation of pinholes in a film can be prevented even if it is thinned, and a highly reliable semiconductor film can be formed.

The object of the invention can be achieved by a method of fabricating a semiconductor device wherein a film is formed on a semiconductor substrate by thermal CVD (chemical vapor deposition), said method comprising the steps of:

charging a surface of the semiconductor substrate with one of positive electricity and negative electricity; and supplying a material gas onto the semiconductor substrate, thus forming a film on the charged surface of the semiconductor substrate.

The object of the invention is also achieved by an apparatus for fabricating a semiconductor device wherein a film is formed on a semiconductor substrate by thermal CVD (chemical vapor deposition), said apparatus comprising:

a lower electrode supporting said semiconductor substrate;

an upper electrode situated to face said lower electrode;

a DC power supply for applying a DC voltage between said upper electrode and said lower electrode, a surface of said semiconductor substrate being charged with one of positive electricity and negative electricity by said DC voltage; and an introducing unit for supplying a material gas onto the surface of the semiconductor substrate, thereby forming a film on the surface of the semiconductor substrate, said charged electricity increasing an initial growth rate of the film and preventing formation of pinholes in said film.

The object of the invention is also achieved by an apparatus for fabricating a semiconductor device wherein a film is formed on a semiconductor substrate by thermal CVD (chemical vapor deposition), said apparatus comprising:

a support member for supporting said semiconductor substrate;

a first introducing unit for supplying an impurity gas onto said semiconductor substrate, said impurity gas including atoms charged with one of positive electricity and negative electricity, said atoms being adsorbed on a surface of the semiconductor substrate; and a second introducing unit for supplying a material gas onto said semiconductor substrate, said material gas forming a film on the surface of the semiconductor substrate, which surface is charged with one of the positive electricity and negative electricity.

In the present invention, the surface of a semiconductor substrate is charged and the growth rate of a film on the surface of the semiconductor substrate is improved at the initial stage of growth. Thus, even if a semiconductor film having a thickness of 0.1 μm or less is formed, formation of pinholes in the film can be prevented.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 schematically shows the structure of a single-wafer-type thermal CVD apparatus according to a first embodiment of the present invention;

FIGS. 2A to 2C show a modeled growth process of a polysilicon film;

FIG. 3 shows a pinhole density in a polysilicon film formed by the method of the present invention, as compared to a conventional method;

FIG. 4 schematically shows the structure of an apparatus according to a second embodiment of the invention;

DETAILED DESCRIPTION OF THE PREFERRED EMBODIMENTS

Figure 5:
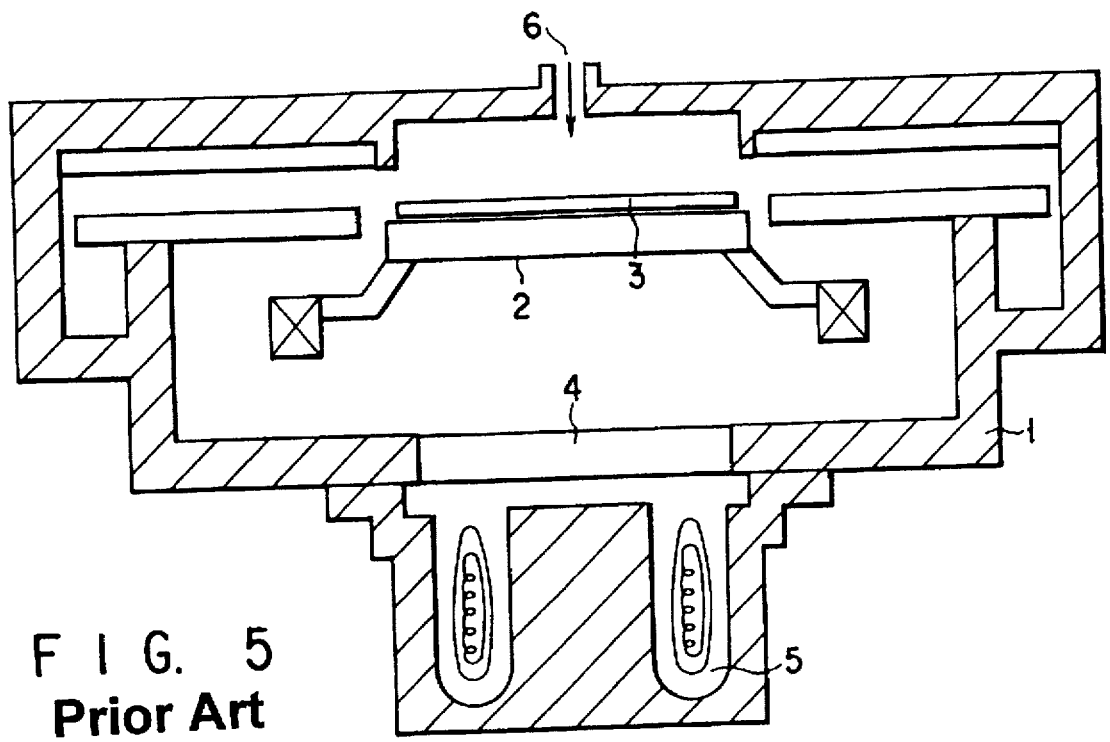
FIG. 5 schematically shows the structure of a single-wafer-type thermal CVD apparatus.
Figure 6A:
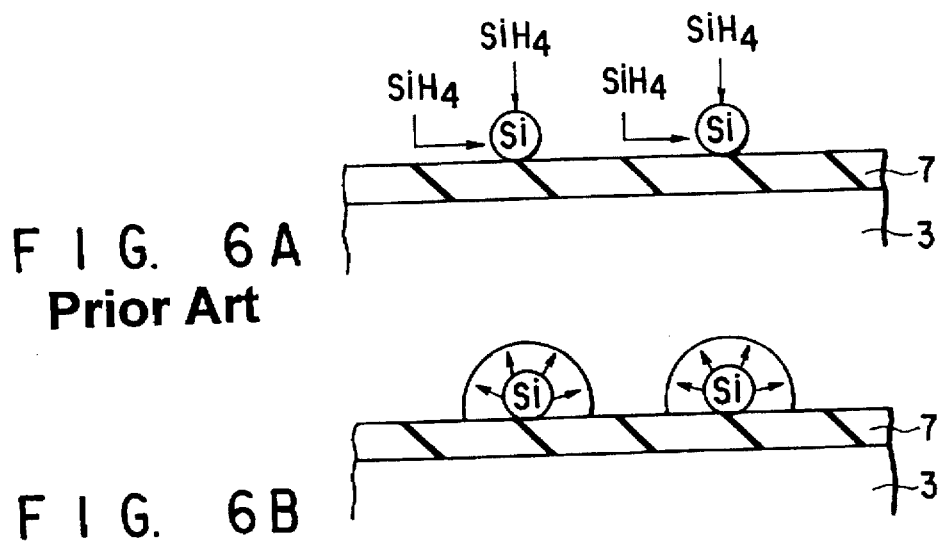
FIGS. 6A to 6C show a modeled process of formation of pinholes.
Figure 6B:
Figure 6C:
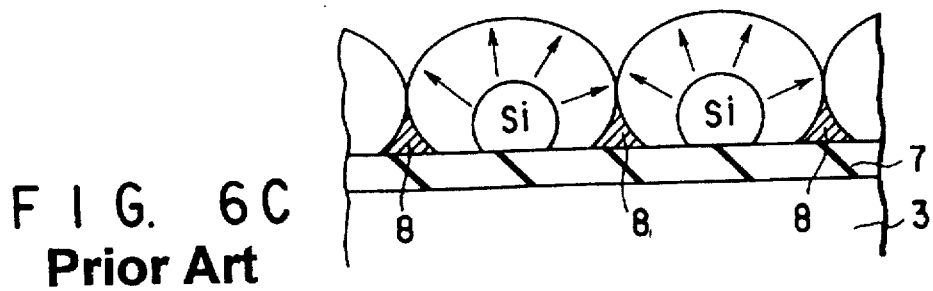

An embodiment of the present invention will now be described with reference to the accompanying drawings.

FIG. 1 schematically shows the structure of a single-wafer-type thermal CVD apparatus according to the present invention. In the single-wafer-type CVD apparatus, a lower electrode 12 serving also as susceptor is provided at a substantially central region of a chamber 11. The lower electrode 12 is formed of a single-crystal silicon (Si), for example, doped with an additive. A semiconductor substrate 13 or an object to be processed is placed on the lower electrode 12.

The reason why the additive-doped single-crystal Si is used as lower electrode 12 is that the film formation temperature for depositing the polysilicon film (semiconductor film) is about 600° to 700° C. and high and, if the lower electrode 12 is formed of a metallic material, the semiconductor substrate 13 may be contaminated by the metallic material. A DC voltage of, e.g. 20 V, is applied from a DC power supply 15 to the lower electrode via electrically conductive support fingers 14.

On the other hand, an upper electrode 16, for example, having a plurality of holes is provided above the lower electrode 12. The upper electrode 16 is formed of, e.g. an additive-doped single-crystal Si. The distance between the upper electrode 16 and the surface of the semiconductor substrate 13 held on the lower electrode 12 is, e.g. about 10 μm. The upper electrode 16 is grounded via an insulator 17. The upper electrode 16 is used as a negative electrode, and the lower electrode 12 is as a positive electrode. A DC voltage of 20 V is applied to the semiconductor substrate 13. Thereby, an electric field of about 0.02 MV/cm is uniformly applied to the surface of the semiconductor substrate 13.

In general, the surface of the semiconductor substrate 13 is covered with an oxide film, as mentioned above. If an electric field is uniformly produced within the surface of the substrate 13, the surface of the oxide film is charged with positive electricity. A halogen lamp 19 is provided below the lower electrode 12. Radiation heat from the halogen lamp 19 is transmitted to the semiconductor substrate 13 through a window 18 formed of quartz. Thus, the semiconductor substrate 13 is heated up to 600° to 700° C.

The pressure within the chamber 11 is reduced to about 0.1 to 1 Torr by a pressure-reducing apparatus (not shown). A gas introducing hole 20 is provided above the upper electrode 16. A gas supply unit 21 supplies a material gas into the chamber 11 via the introducing hole 20. The material gas is, for example, silane gas ($SiH_4$) when a polysilicon film is formed. A baffle plate 21 is provided near the lower electrode 12.

A description will now be given of a process of forming a polysilicon film on a semiconductor substrate with use of the above-described single-wafer-type thermal CVD apparatus.

FIGS. 2A to 2C show a modeled growth process of a polysilicon film. The semiconductor substrate 13 placed on the lower electrode 12 is heated up to about 600° to 700° C. by radiation heat from the halogen lamp 19. In this state, the pressure within the chamber 11 is reduced to about 0.1 to 1 Torr. The lower electrode 12 is used as a positive electrode and the upper electrode 16 as a negative electrode. A DC voltage of 20 V is applied from the DC power supply 15. Then the material gas is introduced into the chamber 11 via the introducing hole 20. As shown in FIGS. 2A to 2C, a polysilicon film is gradually deposited on an oxide film ($SiO_2$) 13a formed on the surface of the semiconductor substrate 13.

As has been described above, the surface of the oxide film 13a on the semiconductor substrate 13 is charged with positive electricity in advance. Thus, the selectivity of growth of polysilicon on the underlayer can be eliminated. Accordingly, the polysilicon film with no pinhole can be obtained.

FIG. 3 shows a pinhole density in a polysilicon film formed on an 8-inch Si wafer (8 φWaf.) to have a thickness of 30 to 80 nm by the method of the present invention, as compared to a conventional method. As is clear from FIG. 3, when the surface of the oxide film 13a on the semiconductor substrate 13 is charged with positive electricity in the step of growing the polysilicon film, no pinhole is observed even if the thickness of the polysilicon film is 30 nm. Therefore, the polysilicon film can be formed with high reliability.

It is conventionally known that the growth rate of the polysilicon film at the initial stage of growth is higher when phosphorus is adsorbed on the surface of the silicon (a negative charge appears to be present on the surface of the silicon) than when boron is adsorbed thereon (a positive charge appears to be present on the surface of the silicon). The cause of this phenomenon has not yet been discovered. It is generally considered, however, that a difference in charged electricity on the surface of silicon is a dominant factor. Specifically, it is considered that hydrogen atoms in silane gas ($SiH_4$) are charged with negative electricity due to electronegativity. Thus, if positive electricity is present on the surface of the semiconductor substrate 13, silane gas tends to be adsorbed on the surface of the substrate 13 due to electrical interaction and the growth rate increases. Accordingly, when the surface of the oxide film 13a is positively charged, the film growth rate increases at the initial stage and the average thickness of the polysilicon film which has completely covered the surface of the oxide film 13a decreases. Thus, even when a polysilicon film 30 nm thick is formed, no pinhole is present therein.

As has been described above, in the present embodiment, the growth rate of the polysilicon film is increased at the initial stage. While the surface of the oxide film on the semiconductor substrate is positively charged, the polysilicon silicon film is formed by the thermal CVD method. Thus, the selectivity between the growth of the polysilicon film on the semiconductor substrate and the growth of the polysilicon film on the oxide film is eliminated. Even if a polysilicon film having a thickness of 0.1 μm or less is formed, no pinhole is formed in the polysilicon film. Therefore, highly reliable polysilicon films can easily be formed irrespective of film thickness.

A second embodiment of the present invention will now be described. In the preceding embodiment, a DC voltage is applied to charge the surface of the semiconductor substrate with positive electricity. This invention, however, is not limited to the preceding embodiment. In the second embodiment, an impurity gas containing, e.g. atoms, which electrically interact with an oxide film and are positively charged, is introduced into the chamber prior to introduction of the material gas, and positively charged atoms are adsorbed on the oxide film. Specifically, as shown in FIG. 4, a gas containing atoms which can be positively charged, e.g. boron atoms, is introduced into the chamber from a first gas supply unit 31, and the atoms are adsorbed on the oxide film. Then, the material gas is introduced into the chamber from the second gas supply unit 32. By this method, too, formation of pinholes in the formed film can be prevented.

The material gas is not limited to the silane gas. It is possible to use various gases which are adsorbed on the surface of the semiconductor substrate to determine the film growth rate at the initial stage of growth by electrical interaction with the semiconductor substrate.

In the first and second embodiments, the semiconductor substrate is positively charged. However, depending on the characteristics of material gas, the semiconductor substrate may be negatively charged with the same advantages obtained. In this case, with the same apparatus as shown in FIG. 1, a negative DC voltage is applied to the semiconductor substrate. Alternatively, with the same apparatus as shown in FIG. 4, a negatively charged impurity gas is adsorbed on the semiconductor substrate, thereby negatively charging the semiconductor substrate.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of fabricating a semiconductor device wherein a film is formed on a semiconductor substrate by thermal CVD (chemical vapor deposition), said method comprising the steps of:

charging a surface of the semiconductor substrate with one of positive voltage and negative voltage; and supplying a material gas onto the semiconductor substrate, thus forming a film on the charged surface of the substrate, wherein said surface of the semiconductor substrate includes an oxide film, and said film formed on the charged surface is formed on said oxide film.

2. A method according to claim 1, wherein a DC voltage is applied to said semiconductor substrate, and said surface is charged with one of the positive voltage and negative voltage.

3. A method according to claim 1, wherein atoms contained in an impurity gas, which are charged with one of the positive voltage and negative voltage, are adsorbed on the surface of the semiconductor substrate.

4. A method of fabricating a semiconductor device wherein a film is formed on a semiconductor substrate by thermal CVD (chemical vapor deposition), said method comprising the steps of:

charging a surface of the semiconductor substrate with one of positive voltage and negative voltage; and supplying a material gas onto the surface of the semiconductor substrate, thus forming a film on the surface of the semiconductor substrate, said charged electricity increasing an initial growth rate of the film and preventing formation of pinholes in said film.

5. A method according to claim 4, wherein said surface of the semiconductor substrate includes an oxide film, and said film formed on the surface of the semiconductor film is formed on said oxide film.

6. A method according to claim 5, wherein a DC voltage is applied to said semiconductor substrate, and said surface is charged with one of the positive voltage and negative voltage.

7. A method according to claim 5, wherein an impurity gas, which is charged with one of the positive voltage and negative voltage, is adsorbed on the surface of the semiconductor substrate, and said surface is charged with one of the positive voltage and negative voltage.

8. A method of fabricating a semiconductor device wherein a semiconductor film is formed on a semiconductor substrate by thermal CVD (chemical vapor deposition), said method comprising the steps of:

charging a surface of the semiconductor substrate with one of positive voltage and negative voltage, said surface including an oxide film; and supplying a material gas onto the semiconductor substrate, thus forming a semiconductor film on the oxide film, said charged voltage increasing an initial growth rate of the semiconductor film and preventing formation of pinholes in said semiconductor film.

9. A method according to claim 8, wherein a DC voltage is applied to said semiconductor substrate, and said surface is charged with one of the positive voltage and negative voltage.

10. A method according to claim 8, wherein an impurity gas, which is charged with one of the positive voltage and negative voltage, is adsorbed on the surface of the semiconductor substrate, and said surface is charged with one of the positive voltage and negative voltage.

* * * * *